（12）United States Patent
Potocek et al.

(10) Patent No.: US 12,136,532 B2
(45) Date of Patent: *Nov. 5, 2024

(54) DUAL SPEED ACQUISITION FOR DRIFT CORRECTED, FAST, LOW DOSE, ADAPTIVE COMPOSITIONAL CHARGED PARTICLE IMAGING

(71) Applicant: FEI Company, Hillsboro, OR (US)

(72) Inventors: Pavel Potocek, Eindhoven (NL); Remco Schoenmakers, Eindhoven (NL); Maurice Peemen, Eindhoven (NL); Bert Henning Freitag, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/964,411

(22) Filed: Oct. 12, 2022

(65) Prior Publication Data

US 2023/0035267 A1    Feb. 2, 2023

Related U.S. Application Data

(63) Continuation of application No. 17/214,747, filed on Mar. 26, 2021, now Pat. No. 11,488,800.

(51) Int. Cl.
*H01J 37/28* (2006.01)
*G01N 23/20091* (2018.01)
(Continued)

(52) U.S. Cl.
CPC .... *H01J 37/1474* (2013.01); *G01N 23/20091* (2013.01); *G01N 23/203* (2013.01);
(Continued)

(58) Field of Classification Search
None
See application file for complete search history.

(56) References Cited

U.S. PATENT DOCUMENTS 8,933,401 B1    1/2015  Reed
10,928,335 B2   2/2021  Potocek
(Continued)

FOREIGN PATENT DOCUMENTS

EP           3598474 A1    1/2020

OTHER PUBLICATIONS

EP22163350.6, Extended European Search Report, Aug. 23, 2022, 18 pages.

*Primary Examiner* — Eliza W Osenbaugh-Stewart
(74) *Attorney, Agent, or Firm* — Klarquist Sparkman, LLP

(57) ABSTRACT

Methods for drift corrected, fast, low dose, adaptive sample imaging with a charged particle microscopy system include scanning a surface region of a sample with a charged particle beam to obtain a first image of the surface region with a first detector modality, and then determining a scan strategy for the surface region. The scan strategy comprises a charged particle beam path, a first beam dwell time associated with at least one region of interest in the first image, the first beam dwell time being sufficient to obtain statistically significant data from a second detector modality, and at least a second beam dwell time associated with other regions of the first image, wherein the first beam dwell time is different than the second beam dwell time. The surface region of the sample is then scanned with the determined scan strategy to obtain data from the first and second detector.

20 Claims, 8 Drawing Sheets

(51) Int. Cl.
*G01N 23/203* (2006.01)
*G01N 23/2254* (2018.01)
*H01J 37/147* (2006.01)
*H01J 37/244* (2006.01)
*H01J 37/26* (2006.01)
*H01J 37/302* (2006.01)

(52) U.S. Cl.
CPC ........ *G01N 23/2254* (2013.01); *H01J 37/244* (2013.01); *H01J 37/265* (2013.01); *H01J 37/28* (2013.01)

(56) References Cited

U.S. PATENT DOCUMENTS

| | | |
|---|---|---|
| 11,488,800 B2 * | 11/2022 | Potocek ............. G01N 23/2254 |
| 2011/0198497 A1 | 8/2011 | Biberger et al. |
| 2013/0015351 A1 | 1/2013 | Kooijman et al. |
| 2016/0118219 A1 | 4/2016 | Potocek et al. |
| 2020/0321188 A1 | 10/2020 | Hujsak et al. |
| 2021/0381992 A1 | 12/2021 | Aguiar |

\* cited by examiner

DUAL SPEED ACQUISITION FOR DRIFT CORRECTED, FAST, LOW DOSE, ADAPTIVE COMPOSITIONAL CHARGED PARTICLE IMAGING

This application is a Continuation of U.S. application Ser. No. 17/214,747, filed Mar. 26, 2021. The application is hereby incorporated by reference.

BACKGROUND OF THE INVENTION

Charged particle microscope systems have been developed to allow scientists to investigate and gather information on how microscopic systems work. In pursuit of such knowledge, scientists push the limits of what current charged particle microscope systems are able to investigate. This is especially true on the atomic and nanoparticle evaluation where, a number of new obstacles to evaluation are experienced due to the size of the objects being investigated. For example, because atoms and nanoparticles are so small that even with the best magnification optics, the majority of an area scanned by a charged particle beam during investigation of such atoms/nanoparticles necessarily corresponds to voids and/or structures other than the atoms/nanoparticles being investigated. This means that current charged particle microscope systems waste time obtaining irrelevant data when evaluating atoms/nanoparticles. Additionally, as the nature of atoms is to create a large void between their nuclei and other atomic structures relative to their size, this problem of scanning spaces between atoms cannot be fixed by increased magnification alone.

Moreover, due to the reduced size of the structures irradiated during evaluation of atoms/nanoparticles, the samples containing the atoms/nanoparticles are more susceptible to damage caused by such irradiation. To compensate for such damage, current charged particle microscope systems reduce the beam strength and length of time the beam irradiates individual structures. While this reduction of bean strength that dwell time reduces the damage to the sample, it also reduces the amount of information obtained during each scan. Thus, to obtain statistically meaningful data current charged particle microscope systems are forced to conduct many repetitive scans (10×-1000×) of a sample before they are able to cumulatively obtain statistically significant data for the atoms/nanoparticles being investigated. This means that current evaluations of such atom/nanoparticle samples can take hours or days.

This repetition further complicates the evaluation of atoms and nanoparticles, as individual shifts between scan instances cause a drift/inaccuracy in the data cumulatively obtained across many scans. Accordingly, better methods for evaluating atoms and nanoparticles are desired to address the time, damage, and accuracy issues of present systems.

SUMMARY OF THE INVENTION

Methods for drift corrected, fast, low dose, adaptive sample imaging with a charged particle microscopy system according to the present disclosure include scanning a surface region of a sample with a charged particle beam to obtain a first image of the surface region with a first detector modality, and then determining a scan strategy for the surface region. The scan strategy comprises a charged particle beam path, a first beam dwell time associated with at least one region of interest in the first image, the first beam dwell time being sufficient to obtain statistically significant data from a second detector modality, and at least a second beam dwell time associated with other regions of the first image, wherein the first beam dwell time is different than the second beam dwell time. The method further includes scanning the surface region of the sample according to the determined scan strategy to obtain first data from the second detector modality and second data from the first modality.

Systems for investigating a sample with a charged particle microscopy system according to the present disclosure comprise a sample holder configured to hold a sample, a charged particle source configured to emit a beam of charged particles towards the sample, an optical column configured to cause the beam of charged particles to be incident on the sample, and one or more detectors configured to detect charged particles of the charged particle beam and/or emissions resultant from the charged particle beam being incident on the sample. According to the present disclosure the one or more detectors include at least a first detector of a first modality and a second detector of a second modality that is different from the first. The systems also include one or more processors, and a memory storing computer readable instructions that, when executed by the one or more processors, cause the corresponding system to perform one or more steps of methods according to the present disclosure.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Figure 1:
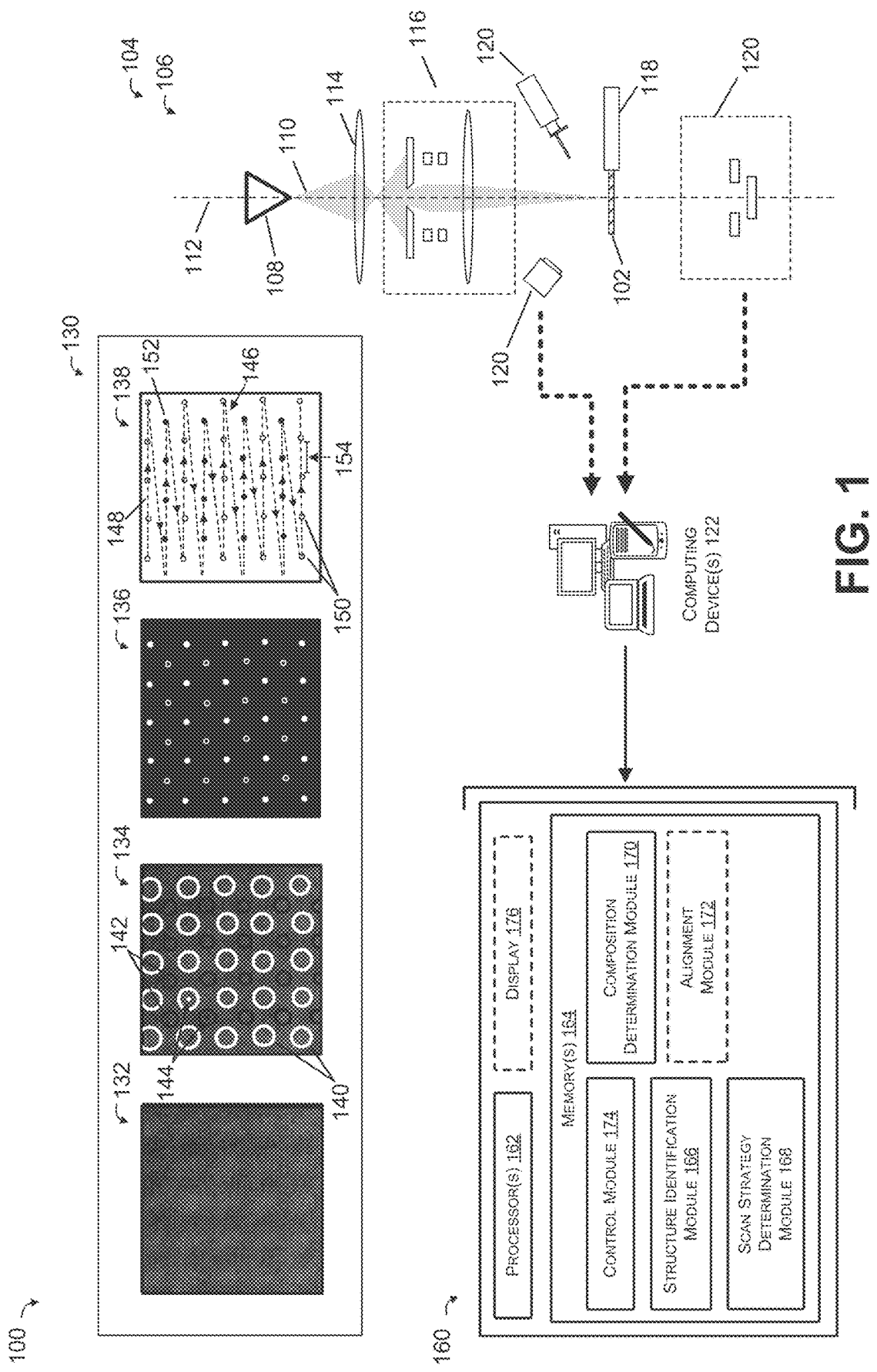
FIG. 1 illustrates example environment for drift corrected, fast, low dose, adaptive sample imaging with a charged particle microscopy system, according to the present disclosure.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Methods and systems for drift corrected, fast, low dose, adaptive sample imaging with a charged particle microscopy system, are included herein. More specifically, the methods and systems disclosed herein include and/or are configured to obtain an initial image of a region of a sample with data from a detector of a first modality, identify structures of interest in the first image, and determine a scan strategy that includes at least two dwell times. For example, a scan strategy may include a first dwell time for irradiating the regions of the sample associated with the structures of interest, and a second dwell time for the regions of the sample that do not include structures of interest.

In various embodiments of the present disclosure, the dwell times may be selected based on an associated type of object of interest, species of object of interest, detector modalities of desired information, or a combination thereof. In this way, the first dwell time can be selected to allow for a statistically significant amount of data for a second modality, while the second dwell time can be chosen to minimize the time taken and/or damage induced during the scanning of portions of the sample that do not include an object of interest. This is especially useful for evaluation of atomic samples and/or nanoparticles, as these sample types require longer dwell times to acquire compositional information (from associated detector modalities) while the majority of the region being scanned will correspond to spaces between the atoms/nanoparticles or other structures that are not of interest. Additionally, in some embodiments there may be multiple dwell times in the scan strategy that individually correspond to different types of objects of interest, different species of objects of interest, different detector modalities required for desired information, or a combination thereof. Moreover, in some embodiments, the path of the beam may also be determined so that the objects of interest are scanned while the amount of other regions of the sample that is scanned are minimized.

In some embodiments, the scan strategy may be repeated until a sufficient amount of data of the second modality is cumulatively obtained so that the objects of interest are compositionally identified, imaged, or otherwise evaluated. Because the scan strategy assigns low dwell times to regions of the sample that do not contain an object of interest, the time costs and sample damage incurred when such repetition was conducted with prior art methods are greatly reduced (e.g., by a factor of 600 or greater). This reduction in scanning time and sample damage allows for scientists and researchers to use the systems and methods of the current disclosure to obtain evaluation results that were not previously possible.

Methods and systems of the present disclosure can also use at least portions of the data obtained from the scanning the regions of the sample that do not include structures of interest with the second dwell time to correct for drift between images. For example, where the first modality is TEM dark field imaging (e.g., HAADF), the dark field imaging data obtained while the sample is irradiated with the second dwell time can be used to align this acquired data (and thus the data obtained with other dwell times) with other instances of data acquired during other scans using the scan strategy. The systems and methods may then adjust the scan strategy to correct for a determined and/or anticipated drift, or may adjust the detected data results in post processing.

FIG. 1 is an illustration of an example environment 100 for drift corrected, fast, low dose, adaptive sample imaging with a charged particle microscopy system, according to the present disclosure. Specifically, FIG. 1 shows example environment 100 as including example charged particle system(s) 104 for investigation and/or analysis of a sample 102. The example charged particle system(s) 104 may be or include one or more different types of optical, and/or charged particle microscopes, such as, but not limited to, a scanning electron microscope (SEM), a scanning transmission electron microscope (STEM), a transmission electron microscope (TEM), a charged particle microscope (CPM), a cryo-compatible microscope, focused ion beam microscope (FIBs), dual beam microscopy system, or combinations thereof. FIG. 1 shows the example charged particle microscope system(s) 104 as being a transmission electron microscope (TEM) 106.

The example charged particle microscope system(s) 104 includes a charged particle source 108 (e.g., a thermal electron source, Schottky-emission source, field emission source, etc.) that emits an electron beam 110 along an emission axis 112 and towards an accelerator lens 114. The emission axis 112 is a central axis that runs along the length of the example charged particle microscope system(s) 104 from the charged particle source 108 and through the sample 102. The accelerator lens 114 that accelerates/decelerates, focuses, and/or directs the electron beam 110 towards a focusing column 116. The focusing column 116 focuses the electron beam 110 so that it is incident on at least a portion of the sample 102. In some embodiments, the focusing column 116 may include one or more of an aperture, scan coils, and upper condenser lens. The focusing column focuses electrons from electron source into a small spot on the sample. Different locations of the sample 102 may be scanned by adjusting the electron beam direction via the scan coils. Additionally, the focusing column 116 may correct and/or tune aberrations (e.g., geometric aberrations, chromatic aberrations) of the electron beam 110. FIG. 1 further illustrates the example charged particle microscope system(s) 104 as further including a sample holder 118 configured to hold the sample 102, and is able to translate, rotate, and/or tilt the sample 102 in relation to the example charged particle microscope system(s) 104.

FIG. 1 also shows the example charged particle microscope system(s) 104 as including multiple detector systems 120 of at least two different modalities. Potential modalities in the example charged particle microscope system(s) 104 may include dark field imaging, bright field imaging, diffraction pattern imaging, electron energy loss spectroscopy (EELS), energy dispersive X-ray spectroscopy (EDS, EDX, or XEDS), cathodoluminescence, and backscatter electrons. For example, a charged particle microscope system may include a HAADF detector system as a first detector modality and an EDS detector system as a second detector modality. The multiple detector systems 120 are further shown as being connected to one or more computing devices 122.

The computing device(s) 122 are configured to control operation of the example charged particle microscope system(s) 104, generate images of sample 102 and/or otherwise determine or interpret data from the multiple detector systems 120. According to the present invention, the computing device(s) 122 are configured to cause the charged particle microscope system(s) 104 to scan a surface region of the sample 102 with charged particle beam 110 (e.g., an electron beam), obtain detector data from a detector system 122 (e.g., a dark field imaging detector system), and then generate an initial image of the surface region based on the detector data. The computing device(s) 122 are further configured to identify structures of interest within the initial image.

Once the structures of interest are identified, the computing device(s) 122 use the location of the structures of interest in the image to determine a scan strategy for the surface region of the sample 102. The scan strategy includes at least a beam path that indicates the path of the charged particle beam 110 when it irradiates the surface of the sample 102, where each portion of the beam path has an associated dwell time (e.g., the amount of time the charged particle beam 110 will irradiate the associated portion of the sample during execution of the scan strategy, a pixel density being scanned by the charged particle beam 110, the size of the pixels being scanned by the charged particle beam 110, a pulse length of the charged particle beam 110, a pulse frequency of the charged particle beam 110, etc.). Specifically, the scan strategy includes one or more beam path portions associated with at least one structures of interest that are assigned a first beam dwell time, and at least one additional dwell time assigned to the remaining portions of the beam path. According to the present invention the first beam dwell time is determined by the computing device(s) 122 to such that it is sufficient to obtain statistically significant data from a second detector modality that is different from the first detector modality used to obtain the initial image. Statistically significant data includes a quantity or quality of data describing the material properties and/or interrelations thereof for the corresponding structure of interest that is statistically not the result of chance. Specifically, the first dwell time is determined such that the data obtained within a threshold number of scans using the scan strategy is sufficient to enable a compositional determination to be made about corresponding structures of interest. For example, the first dwell time may be determined such that when the sample is scanned a threshold number of times with the scan strategy, enough data will be obtained to allow for a determination of the species of the atoms scanned with the first dwell time. In different embodiments, a sufficient amount of data to make such compositional determinations is acquired in a single scan or within a threshold number of scans. The computing device(s) 122 are further configured to cause the charged particle microscope system(s) 104 to scan the surface region of the sample according to the determined scan strategy to obtain first data from the second detector modality and second data from the first modality. The first data may then be used by the computing device(s) 122 to identify and/or otherwise determine compositional information about individual structures of interest. In some embodiments, where the computing device(s) 122 cause the charged particle microscope system(s) 104 to scan the surface region more than one time, the second data may be used to determine and/or correct for drift between the images generated from individual iterations of the second data.

Those skilled in the art will appreciate that the computing devices 122 depicted in FIG. 1 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing devices 122 may also be connected to other devices that are not illustrated, or instead may operate as a stand-alone system. In addition, the functionality provided by the illustrated components may in some implementations be combined in fewer components or distributed in additional components. Similarly, in some implementations, the functionality of some of the illustrated components may not be provided and/or other additional functionality may be available.

It is also noted that the computing device(s) 122 may be a component of the example charged particle microscope system(s) 104, may be a separate device from the example charged particle microscope system(s) 104 which is in communication with the example charged particle microscope system(s) 104 via a network communication interface, or a combination thereof. For example, an example charged particle microscope system(s) 104 may include a first computing device 122 that is a component portion of the example charged particle microscope system(s) 104, and which acts as a controller that drives the operation of the example charged particle microscope system(s) 104 (e.g., adjust the scanning location on the sample 102 by operating the scan coils, causes translations of the sample 102, etc.). In such an embodiment the example charged particle microscope system(s) 104 may also include a second computing device 120 that is desktop computer separate from the example charged particle microscope system(s) 104, and which is executable to process data received from one or more detector system(s) 120 to generate images of the sample 102, determine scan strategies for the sample 102, and/or perform other types of analysis. The computing devices 122 may further be configured to receive user selections via a keyboard, mouse, touchpad, touchscreen, etc.

FIG. 1 also depicts a visual flow diagram 130 that includes a plurality of images that together depict an example process that may be performed by the computing device(s) 122 as part of drift corrected, fast, low dose, adaptive imaging of sample 102 with a charged particle microscopy system(s) 104, according to the present disclosure. For example, image 132 shows an image of a surface region of sample 102 that is generated by computing device(s) 122 based on sensor data from a detector system 120 of a first modality. For example, FIG. 1 illustrates a lower resolution image of the surface of the sample 102 obtained with a HAADF detector data. Image 134 shows an updated version of image 132 in which structures of interest that have been identified by the computing system(s) 122 are visually indicated. Specifically, image 134 shows a first plurality of regions 140 of the image that have been identifies as corresponding to an atom of a first species, and a second plurality of regions 142 that have been identifies as corresponding to an atom of a second species. In other embodiments, the structures of interest may correspond to chemical compounds, nanoparticles, etc. In various embodiments, the plurality of regions may be identified using one or more of an image sharpening algorithm, an image recognition algorithm, a machine learning algorithm, and user selections. Image 134 also includes a representative pixel or collection of pixels 144 for a corresponding identified region. Such representative pixel(s) 144 may correspond to a central pixel(s), pixel(s) furthest from an edge, and/or pixel(s) otherwise determined to have a high likelihood of returning compositional information relating to the corresponding structure of interest when irradiated.

Image 136 is a mask that identifies locations on the surface of the sample 102 that are to be irradiated to determine compositional information for the corresponding structures of interest. In some embodiments, the mask may indicate a dwell time associated with each species of atom that has been determined by the computing device(s) 122 based on the type of structure of interest, the species of structure of interest, or both. In image 136 the locations to be irradiated correspond to the representative pixel(s) 144 determined with relation to image 134. Image 136 shows the mask as optionally differentiating irradiation locations according to their associated atom species.

Image 138 illustrates a scan strategy 146 determined by the computing device(s) 122 based on the image 132 of the surface of the sample 102 generated with detector data of a first modality. The scan strategy 146 indicates a beam path 148 that the charged particle is to traverse when it irradiates the surface of the sample 102. Additionally, image 138 shows each portion of the beam path 148 as being associated with a dwell time (e.g., the amount of time the charged particle beam 110 will irradiate the associated portion of the sample during execution of the scan strategy 146). Specifically, the scan strategy 146 includes first dwell times for first beam path portions 150 associated with the centers of the atoms of the first species identified in image 132, and second dwell times for second beam path portions 152 associated with the centers of the atoms of the second species identified in image 132. In some embodiments, the computing device(s) 122 are configured to determine different dwell times for different types of objects of interest, different species of objects of interest, different detector modalities required for desired information, or a combination thereof. Alternatively, the dwell time associated with each structure of interest may be the same for all types and/or species. Scan strategy 146 is further shown as including a third dwell time for portions 154 of the beam path that do not correspond to structures of interest. The third dwell time may correspond to the same dwell time used to obtain image 132.

FIG. 1 further includes a schematic diagram illustrating an example computing architecture 160 of the computing devices 122. Example computing architecture 160 illustrates additional details of hardware and software components that can be used to implement the techniques described in the present disclosure. Persons having skill in the art would understand that the computing architecture 160 may be implemented in a single computing device 122 or may be implemented across multiple computing devices. For example, individual modules and/or data constructs depicted in computing architecture 160 may be executed by and/or stored on different computing devices 122. In this way, different process steps of the inventive method according to the present disclosure may be executed and/or performed by separate computing devices 122.

In the example computing architecture 160, the computing device includes one or more processors 162 and memory 164 communicatively coupled to the one or more processors 162. The example computing architecture 160 can include a structure identification module 166, a scan strategy determination module 168, a composition determination module 170, an optional alignment module 172, and a control module 174 stored in the memory 164.

As used herein, the term "module" is intended to represent example divisions of executable instructions for purposes of discussion, and is not intended to represent any type of requirement or required method, manner or organization. Accordingly, while various "modules" are described, their functionality and/or similar functionality could be arranged differently (e.g., combined into a fewer number of modules, broken into a larger number of modules, etc.). Further, while certain functions and modules are described herein as being implemented by software and/or firmware executable on a processor, in other instances, any or all of modules can be implemented in whole or in part by hardware (e.g., a specialized processing unit, etc.) to execute the described functions. As discussed above in various implementations, the modules described herein in association with the example computing architecture 160 can be executed across multiple computing devices 122.

The control module 174 can be executable by the processors 162 to cause a computing device 122 and/or example charged particle microscope system(s) 104 to take one or more actions. For example, the control module 174 may cause the example charged particle microscope system(s) 104 to scan a surface of the sample 102 by causing the charged particle beam 110. The computing device 112 may then be configured to generate an initial image of the surface of the sample 102 based on detector data from a detector system 120 of a first modality obtained when the surface of the sample 102 is scanned. In an alternate example, the control module 174 may cause the example charged particle microscope system(s) 104 to scan a surface of the sample 102 according to a scanning strategy determined by the computing devices 122 based on the initial image.

The structure identification module 166 can be executable by the processors 162 to structures of interest within an initial image of a surface of sample 102 obtained with a detector system 120 of a first modality. In some embodiments, the feature determination module 164 can be executable by the processors 162 to first sharpen the initial image using a sharpening algorithm. For example, the structure identification module 166 may employ a neural network based sharpening algorithm to improve the resolution of the initial image. In this way, according to the present disclosure the initial image may be obtained with a reduced dwell time and/or beam strength such that time wasted and/or sample damage is reduced.

The structures of interest identified by the structure identification module 116 may correspond to atoms, molecules, chemical compound, nanoparticles, and species or types thereof. For example, the structure identification module 166 may identify regions of the initial image that correspond to individual nanoparticles and/or a component portion of nanoparticles such as a boundary, an edge, a material transition, a component substructure, etc. Alternatively or in addition, the structure identification module 166 may identify regions for different types or species of structures of interest within the initial image. For example, the structure identification module 166 may identify a first set of regions of the initial image that correspond to a first compound structure, and a second set of regions of the initial image that correspond to a second compound structure. In some embodiments, the structure identification module 166 is further configured to identify representative pixel or pixels associated with individual instances of identified structures of interest (e.g., a central pixel(s), pixel(s) furthest from an edge, and/or pixel(s) otherwise determined to be representative of the structure of interest).

In various embodiments of the present disclosure, the structure identification module 166 may identify the structures of interest using one or more of an identification algorithm, a machine learning module (e.g., an artificial neural network (ANN), convolutional neural network (CNN), Fully Convolution Neural Network (FCN) etc.) trained to identify instances of one or more structures of interest, user selections, and/or a combination thereof. For example, a neural network may be employed to segment the initial image according to whether the corresponding pixels contain a structure of interest. This segmented image may then be presented to a user via display 176 and a user may select individual segmented regions to be investigated. Where the structure identification module 166 segments the initial image into a plurality of different types of regions (i.e., regions likely to have no structures of interest, regions having a first type/species of structure of interest, regions having a second type/species of structure of interest, etc.) a user may select individual types of regions that are to be investigated. In an alternate example, the structure identification module 166 may apply an algorithm to such a segmented image that is programmed to select regions to be investigated based on the characteristics/features of the regions (e.g., size, shape, location, proximity to other regions, etc.).

The scan strategy determination module 168 can be executable by the processors 162 to identify a scan strategy that is especially customized to the region of the sample 102 being investigated. Specifically, the scan strategy determination module 168 is executable to identify a beam path that the charged particle beam 110 is going to follow when scanning the sample 102, break up the beam path into portions based on whether they correspond to a portion of the sample determined to have a structure of interest, and/or the type or species of structure of interest they correspond to. The beam path may correspond to a preprogrammed beam path that is constant for all samples, or may be individual customized to the sample being investigated. For example, the scan strategy determination module 168 may determine a beam path that irradiates the regions of the sample determined to have structures of interest and/or associated representative pixels.

The scan strategy determination module 168 may further be executable to assign dwell times to the different portions of the beam path based on whether they correspond to a portion of the sample determined to have a structure of interest, and/or the type or species of structure of interest they correspond to. For example, the based on whether they may determine portions of the beam path that irradiate regions of the sample 102 that are not associated with a structure of interest, and then assign to those portions of the beam path a reduced dwell time. While such a reduced dwell time may be sufficient to obtain data from the first modality used to generate the initial image, the reduced dwell time lowers the amount of time spent scanning the portions of the sample that do not include structures of interest while also generally reducing sample damage. This is especially valuable in instances where the structures being investigated are atoms, nanoparticles, or structures thereof as a large majority of the region being irradiated in such investigations will necessarily correspond to empty space and/or contain structures in which a user is not interest in. In this way, assigning the reduced dwell time to such regions of the beam path can result in a time savings of over 100× compared to prior art systems.

The scan strategy determination module 168 further assigns higher dwell times portion of the beam path that correspond to a structure of interest (e.g., portions that correspond to pixels that include the center of atoms, only an edge structure of a nanoparticle, etc.), where the higher dwell time is sufficient to obtain statistically significant data from a detector system 120 of a second modality. For example, the scan strategy determination module 168 may assign a particular dwell time to a pixel determined to correspond to the center of an atom of interest that is sufficient such that, when the region of the sample is irradiated with the particular dwell time the computing device 122 is able to obtain sufficient data from an EDS detector system to make a compositional determination relating to the atom. In some embodiments, the particular dwell time is a preset dwell time that is assigned to all beam path portions corresponding to structures of interest, or may be determined by the scan strategy determination module 168 based on a type/sensitivity of a detector modality that is desired, a type of structure of interest, a species of structure of interest, or a combination thereof. For example, the scan strategy determination module 168 may assign a first dwell time to portions of the beam path corresponding to structures of interest of a first species and a second dwell time to portions of the beam path corresponding to structures of interest of a second, different species. In this way, the scan strategy determination module 168 is able to generate a scan strategy that is customized to obtain statistically significant data relating to multiple types of structures of interest while minimizing the time it takes to acquire such data and minimizing the damage to the sample. In some embodiments, the scan strategy determination module 168 may further be configured to vary the beam strength of the charged particle beam 110 based on whether a portion of the beam path corresponds to a portion of the sample determined to have a structure of interest, and/or the type or species of structure of interest it corresponds to.

The scan composition determination module 170 can be executable by the processors 162 to determine compositional information about the structures of interest in the sample 102 based on the detector data of a detector system 120 of the second modality obtained when the sample 102 is scanned using the customized scan strategy. For example, where the second modality corresponds to an EDS detector system, the scan composition determination module 170 may determine a species of atom and/or material composition of a nanoparticle or portion thereof.

In some embodiments, based on the scan composition determination module 170 determining that there is an insufficient amount of detector data of the second modality to make a composition determination for a structure of interest, the scan composition determination module 170 may cause the charged particle microscope system(s) 104 to perform an additional scan of the sample 102 using the customized scan strategy. In some embodiments this may repeat until compositional information is determined for all or a threshold number of structures of interest. Alternatively, or in addition, this may repeat until the scan composition determination module 170 determines that additional scans will cause sample damage exceeding a threshold and/or such that one or more structures of interest will be (or have been) destroyed.

The optional alignment module 172 may be executable by the processors 162 to align images and/or detector data obtained during repeated scans of the sample using the customized scan strategy. For example, the alignment module 172 may use at least portions of the data obtained from the scanning the regions of the sample that do not include structures of interest to correct for drift between the acquisition of images. For example, where the first modality is TEM dark field imaging (e.g., HAADF), the dark field imaging data obtained while the sample is irradiated with the reduced dwell time can be used to align resultant images as well as the data of other modalities obtained with increased dwell times with data acquired during other scans using the customized scan strategy. The optional alignment module 172 may then adjust the scan strategy to correct for a determined and/or anticipated drift, or perform post processing on the detected data may adjust for the drift. In this way, the alignment module 172 is able to ensure that the charged particle microscope system(s) 104 obtains high resolution images even when multiple scans are required to obtain sufficient compositional information.

As discussed above, the computing devices 122 include one or more processors 162 configured to execute instructions, applications, or programs stored in a memory(s) 164 accessible to the one or more processors. In some examples, the one or more processors 162 may include hardware processors that include, without limitation, a hardware central processing unit (CPU), a graphics processing unit (GPU), and so on. While in many instances the techniques are described herein as being performed by the one or more processors 162, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories 164 accessible to the one or more processors 162 are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory 164 and other storage devices for purposes of memory management and data integrity. Alternatively, in other implementations, some or all of the software components may execute in memory on another device and communicate with the computing devices 122. Some or all of the system components or data structures may also be stored (e.g., as instructions or structured data) on a non-transitory, computer accessible medium or a portable article to be read by an appropriate drive, various examples of which are described above. In some implementations, instructions stored on a computer-accessible medium separate from the computing devices 122 may be transmitted to the computing devices 122 via transmission media or signals such as electrical, electromagnetic, or digital signals, conveyed via a communication medium such as a wireless link. Various implementations may further include receiving, sending or storing instructions and/or data implemented in accordance with the foregoing description upon a computer-accessible medium.

Figure 2:
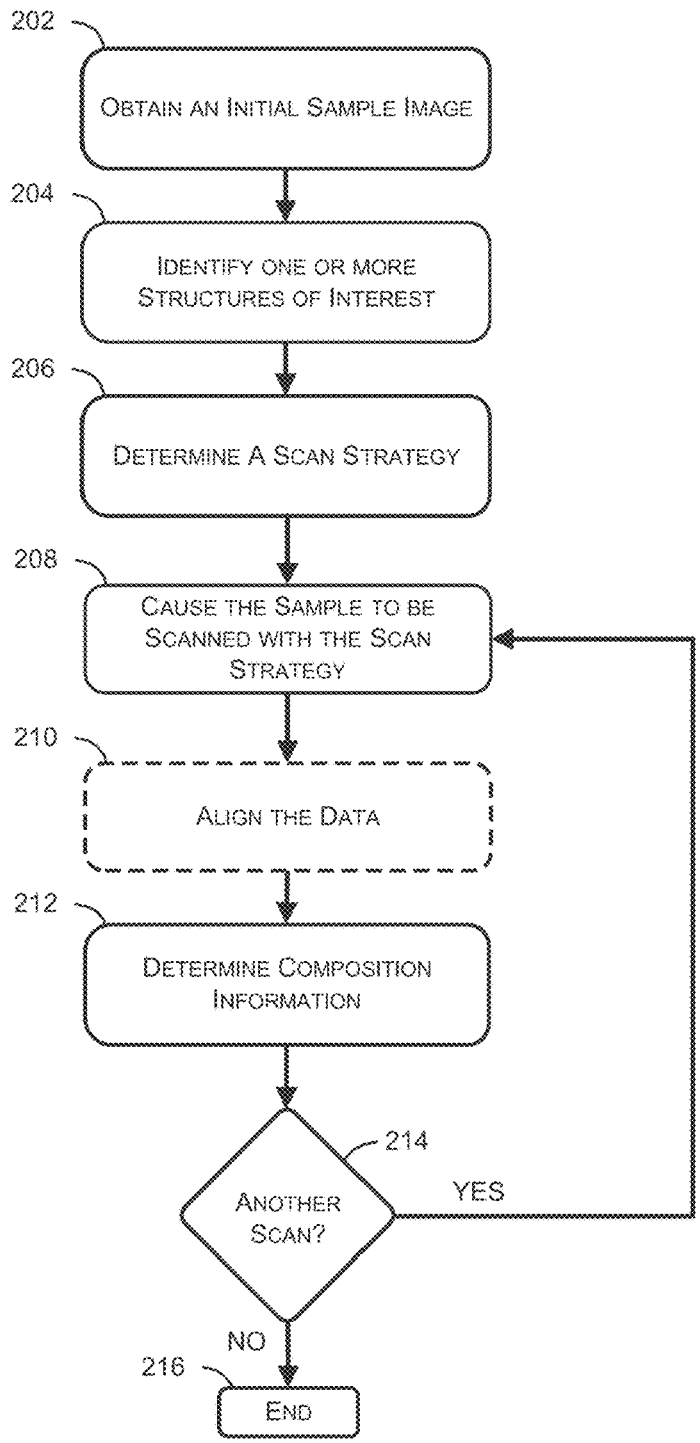
FIG. 2 illustrates a sample process for drift corrected, fast, low dose, adaptive sample imaging with a charged particle microscopy system according to the present invention.

FIG. 2 is a depiction of a sample process 200 for drift corrected, fast, low dose, adaptive sample imaging with a charged particle microscopy system according to the present invention. The process 200 may be implemented by any of the example charged particle microscope system(s) 104, computing device(s) 122, and computing architecture 160.

At 202, an initial image of a sample is obtained using data from a first detector modality. Detector data of a first modality may be obtained by scanning the surface of the sample with a charged particle beam, and then the initial image may be obtained based on the detector data of the first modality. In some embodiments, the first modality may correspond to dark or light field imaging (e.g., HAADF).

At 204, one or more structures of interest are identified in the initial image. In various embodiments of the present disclosure, the structures of interest may be identified using one or more of an identification algorithm, a machine learning module (e.g., an artificial neural network (ANN), convolutional neural network (CNN), Fully Convolution Neural Network (FCN) etc.) trained to identify instances of one or more structures of interest, user selections, and/or a combination thereof. The structures of interest identified may correspond to atoms, molecules, chemical compound, nanoparticles, and species or types thereof. For example, the regions of the initial image that correspond to individual nanoparticles and/or a component portion of nanoparticles such as a boundary, an edge, a material transition, a component substructure, etc. may be identified. In various embodiments a single type/species of structure of interest may be identified within the initial image, or a plurality of different types/species of structure of interest may be identified within the initial image. Additionally, representative pixel or pixels associated with individual instances of identified structures of interest (e.g., a central pixel(s), pixel(s) furthest from an edge, and/or pixel(s) otherwise determined to be representative of the structure of interest) may be determined. Moreover, in some embodiments, a sharpening algorithm may be used to improve the resolution of initial image to allow for the structures of interest to be more readily identified.

At 206, a scan strategy is determined that is customized based on the structures of interest identified in step 204. The scan strategy comprises a beam path that the charged particle beam is going to follow when the sample is scanned, where each portion of the beam path is assigned a dwell time based on whether the portion is associated with a structure of interest. Specifically, portions of the beam path that are associated with a structure of interest are assigned an increased dwell time that allows for a statistically significant amount of data of a second modality to be obtained relating to the corresponding structure of interest when the charged particle beam traverses that portion of the beam path. For example, a customized scan strategy may assign higher dwell times portion of the beam path that correspond to a structure of interest (e.g., portions that correspond to pixels that include the center of atoms, only an edge structure of a nanoparticle, etc.). The increased dwell time may correspond to a preset dwell time that is assigned to all beam path portions corresponding to structures of interest, or may be determined based on a type/sensitivity of a detector modality that is desired, a type of structure of interest, a species of structure of interest, or a combination thereof. Additionally, according to the present disclosure, the regions of beam path that are not associated with a structure of interest are assigned a reduced dwell time. While such a reduced dwell time may be sufficient to obtain data from the first modality used to generate the initial image, the reduced dwell time lowers the amount of time spent scanning the portions of the sample that do not include structures of interest while also generally reducing sample damage.

At 208, the sample is scanned again using the scan strategy. Specifically, a charged particle beam irradiates the portion of the sample using the beam path and dwell times specified in the customed scan strategy. In this way, higher dwell times associated with the structures of interest allow for the acquisition of statistically significant data from the detector system of the second modality, while less time is spent scanning regions of the sample that do not contain a structure of interest. However, detector data of the first modality may be obtained based on the irradiation of the regions determined not to contain a structure of interest with the reduced dwell time.

At 210, the data obtained based on the scanning is optionally aligned with data from prior scans. Specifically, the data obtained based on the irradiation of the regions with the reduced dwell time may be used to align any images generated and/or detector data obtained during repeated scans of the sample using the customized scan strategy. For example, between each iteration of scanning of the sample using the scan strategy there may be a change in orientation or alignment of the sample within the charged particle system. According to some embodiments of the present disclosure, the data obtained based on irradiation of regions which do not contain a structure of interest may be compared to this same data as obtained in prior scans to determine a relative position/orientation between the newly obtained image/data with data from the prior scans. This relative position/orientation may then be used to orient and/or otherwise align the data of the second modality across the multiple iterations. For example, based on a determination of a drift, the positions associated with the data of the second modality may be adjusted to account for the drift (e.g., a different portion of data of the second modality is attributed to being from the center of an atom).

At 212, compositional information is determined based on data of a second detector modality obtained during the scanning in step 208. For example, where the second modality corresponds to an EDS detector system, the EDS data may be used to determine a species of atom and/or material composition of a nanoparticle or portion thereof.

At 214, it is determined whether an additional scan of the sample should be conducted. In some embodiments, this determination is based on whether there was a sufficient amount of detector data of the second modality to make a composition determination for a structure of interest, and/or a threshold number of structures of interest. In this way, the sample may be repeatedly scanned using the customized scanning strategy until compositional information is determined for all or a threshold number of structures of interest, or until it is determined that additional scans will cause sample damage exceeding a threshold and/or such that one or more structures of interest will be (or have been) destroyed. If the answer at step 214 is yes, the process returns to step 208 and the sample is again scanned using the scan strategy. If the answer at step 214 is no, the process ends.

Figure 3:
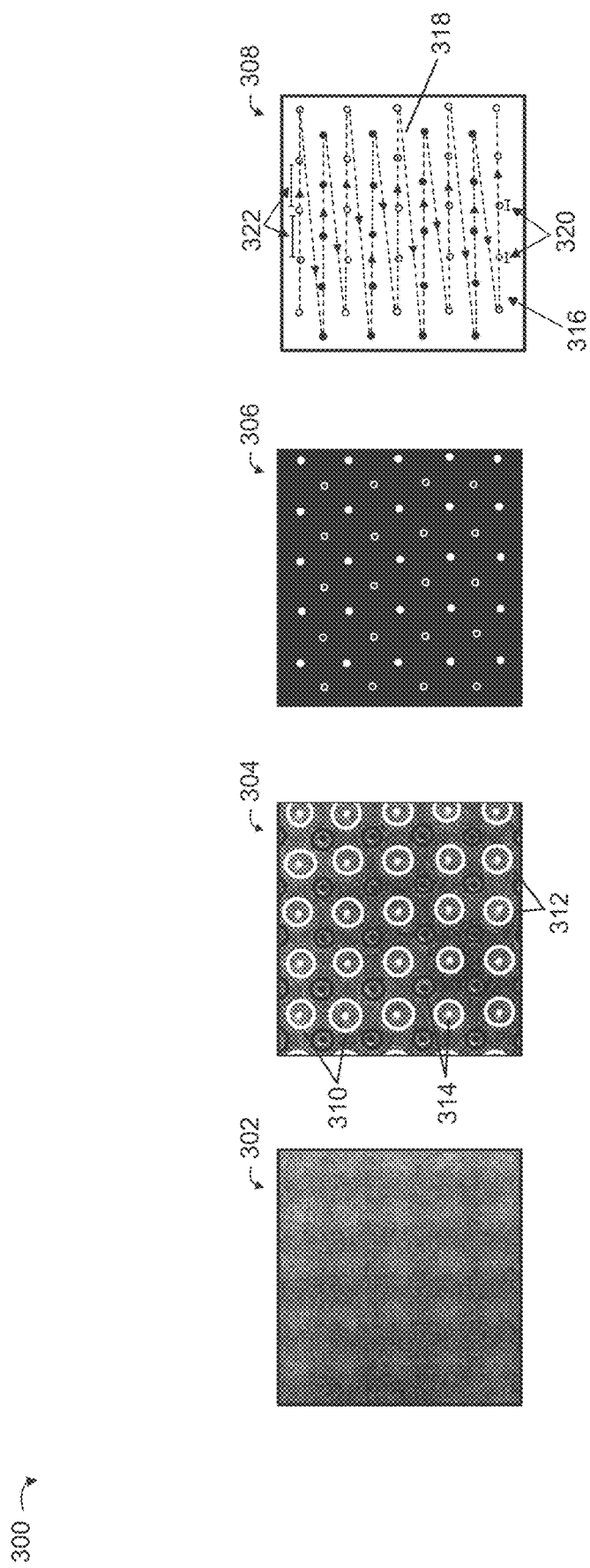
FIGS. 3 and 4 illustrate sets of diagrams that illustrate processes for determining a customized scan strategy based on an initial sample image.

FIG. 3 shows a set of diagrams that illustrate a process 300 for determining a customized scan strategy based on an initial sample image. FIG. 3 shows a depiction of an initial image of a sample 302 obtained using detector data from a first modality. Specifically, initial image 302 corresponds to an image of a sample comprising an array two species of atoms that was generated using HAADF detector data. FIG. 3 further illustrates shows the initial image with a plurality of overlays 310 and 312 that correspond to regions of the initial image that have been determined to correspond to a structure of interest (i.e., atom) of a first species, and a structure of interest (i.e., atom) of a second species, respectively. Image 304 further shows representative pixel(s) 314 that have been determined to be representative of the corresponding region (i.e., a central pixel(s), pixel(s) furthest from an edge, and/or pixel(s) otherwise determined to have a high likelihood of returning compositional information relating to the corresponding structure of interest when irradiated).

FIG. 3 also depicts a mask 306 generated using the regions of interest 310 and 312 and/or the representative pixels 314. The mask 306 identifies the regions of the sample that are to be irradiated to generate detector data of a second modality which allows for compositional information (or other information) to be obtained about the corresponding structure of interest (i.e., atom). Black areas of the mask 306 are scanned with a fast dwell time (e.g., a background raster scan such as HAADF signal which may be used for drift compensation and verification of EDS/structure of interest positioning) while the white artifacts correspond to regions that are to be scanned with a slow dwell time (e.g., slow dwell times allowing for the acquisition of sufficient EDS data to compositionally identify the structures of interest). Mask 306 differentiates between the representative pixels for the structure of interest of the first species and the structure of interest of the second species. However, in other embodiments no such differentiation may be present in the mask.

FIG. 3 also shows a customized scan strategy 316 for the sample that is generated based on the mask/representative pixel(s). The scan strategy 316 indicates a beam path 318 that the charged particle is to traverse when it irradiates the surface of the sample. Additionally, image 308 shows each portion of the beam path 318 as being associated with a dwell time (e.g., the amount of time the charged particle beam will irradiate the associated portion of the sample during execution of the scan strategy). Specifically, the scan strategy 316 includes first dwell times for first beam path portions 320 associated with the centers of the atoms identified in image, and second dwell times for second beam path portions 322 that are not associated with structures of interest.

Figure 4:
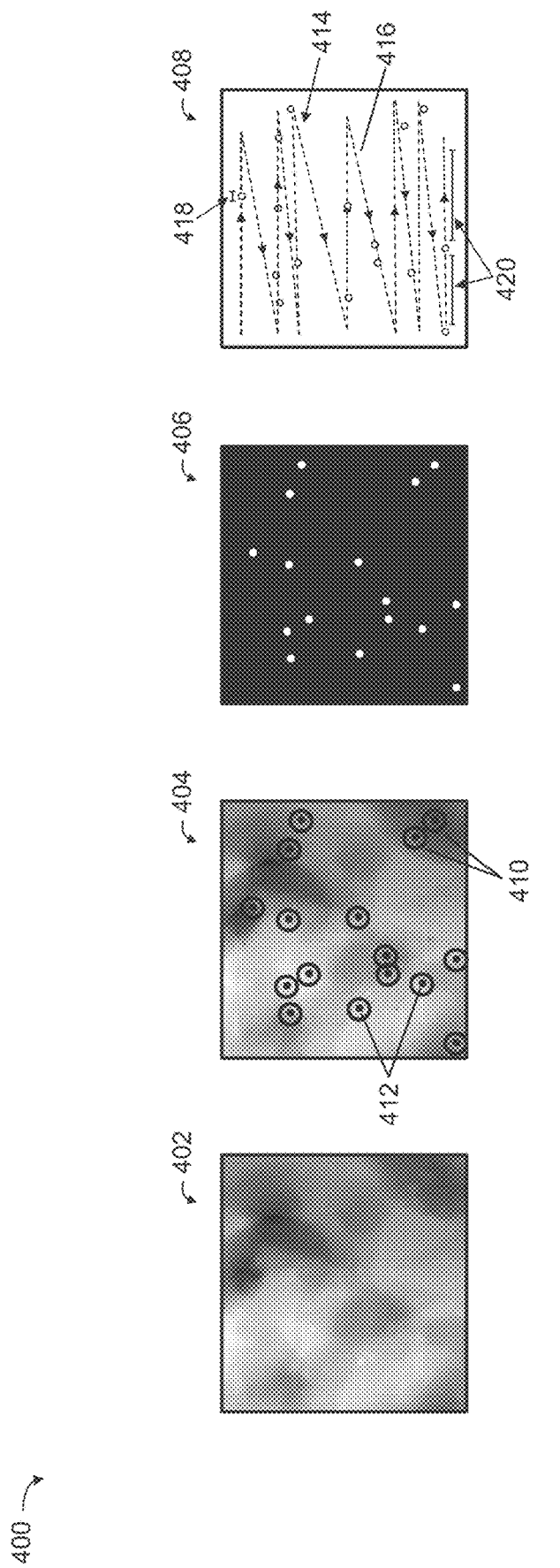

FIG. 4 shows a set of diagrams that illustrate a process 400 for determining a customized scan strategy based on an initial sample image. FIG. 4 shows a depiction of an initial image of a sample 402 comprising nanoparticles that was obtained using detector data from a first modality (HAADF detector data). FIG. 4 further illustrates shows the initial image with a plurality of overlays 410 that correspond to regions of the initial image that have been determined to correspond to a structure of interest (i.e., nanoparticle). Image 404 further shows representative pixel(s) 412 that have been determined to be representative of the corresponding structure of interest (i.e., a central pixel(s), pixel(s) furthest from an edge, and/or pixel(s) otherwise determined to have a high likelihood of returning compositional information relating to the corresponding structure of interest when irradiated).

FIG. 4 also depicts a mask 406 generated using the regions of interest 410 and/or the representative pixels 412. The mask 406 identifies the regions of the sample that are to be irradiated to generate detector data of a second modality which allows for compositional information (or other information) to be obtained about the corresponding structure of interest (i.e., nanoparticle). Black areas of the mask 406 are scanned with a fast dwell time (e.g., a background raster scan such as HAADF signal which may be used for drift compensation and verification of EDS/structure of interest positioning) while the white artifacts correspond to regions that are to be scanned with a slow dwell time (e.g., slow dwell times allowing for the acquisition of sufficient EDS data to compositionally identify the structures of interest).

FIG. 4 also shows a customized scan strategy 414 for the sample that is generated based on the mask/representative pixel(s). The scan strategy 414 indicates a beam path 414 that the charged particle is to traverse when it irradiates the surface of the sample. The beam path 414 has been generated so that each representative pixel is scanned, while minimizing the other regions that are scanned. The scan strategy 414 includes first dwell times for first beam path portions 418 associated with the centers of the nanoparticles identified in image, and second dwell times for second beam path portions 420 that are not associated with structures of interest.

Figure 5:
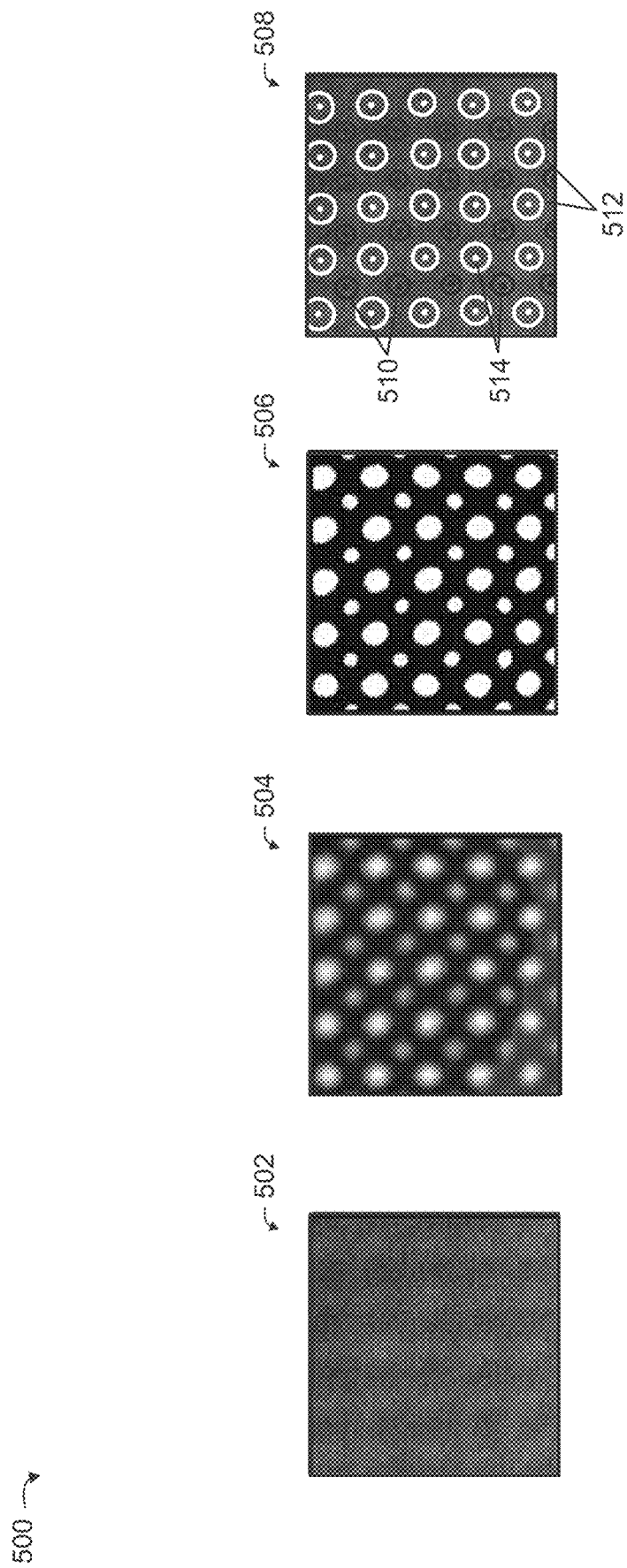
FIG. 5 illustrates a set of diagrams that illustrate a process for identifying structures of interest in an initial image.

FIG. 5 shows a set of diagrams that illustrate a process 500 for identifying structures of interest in an initial image. FIG. 5 shows a depiction of an initial image of a sample 502 comprising nanoparticles that was obtained using detector data from a first modality (HAADF detector data). FIG. 5 also includes a modified version 504 to which one or more sharpening algorithm, one or more image recognition algorithms, or a combination thereof have been applied. Specifically, image 504 corresponds to the result of a neural network that has been train in sequence for denoising charged particle images and segmentation such images based on whether regions thereof are likely to include an atom. The resulting image 504 shows the probabilities that individual regions of the sample that the neural network contain an atom, with regions which have been determined to be more likely to include an atom being shown as lighter, and the regions which have been determined to be less likely to include an atom being shown as darker.

Image 506 corresponds to a version of image 504 to which a binary threshold probability has been applied. That is, regions that have been determined to have a likelihood of containing an atom that is greater than a threshold value are shown as white, while the regions that do not meet or exceed this threshold are shown as black. Based on image 506, an algorithm or user can determine which regions of the image correspond to atoms. Additionally, in some embodiments an algorithm or user can further identify regions that correspond to atoms of the same species. FIG. 5 further illustrates shows the initial image with a plurality of overlays 510 and 512 that correspond to regions of the initial image that have been determined to correspond to a structure of interest (i.e., atom) of a first species, and a structure of interest (i.e., atom) of a second species, respectively. For example, these overlays 510 and 512 may be determined by applying a fit circle into the individual binary objects of image 506. Image 508 further shows representative pixel(s) 514 that have been determined to be representative of the corresponding region (i.e., a central pixel(s), pixel(s) furthest from an edge, and/or pixel(s) otherwise determined to have a high likelihood of returning compositional information relating to the corresponding structure of interest when irradiated). For example, the representative pixels 514 correspond to the center of the circles used to fit the binary objects.

Figure 6:
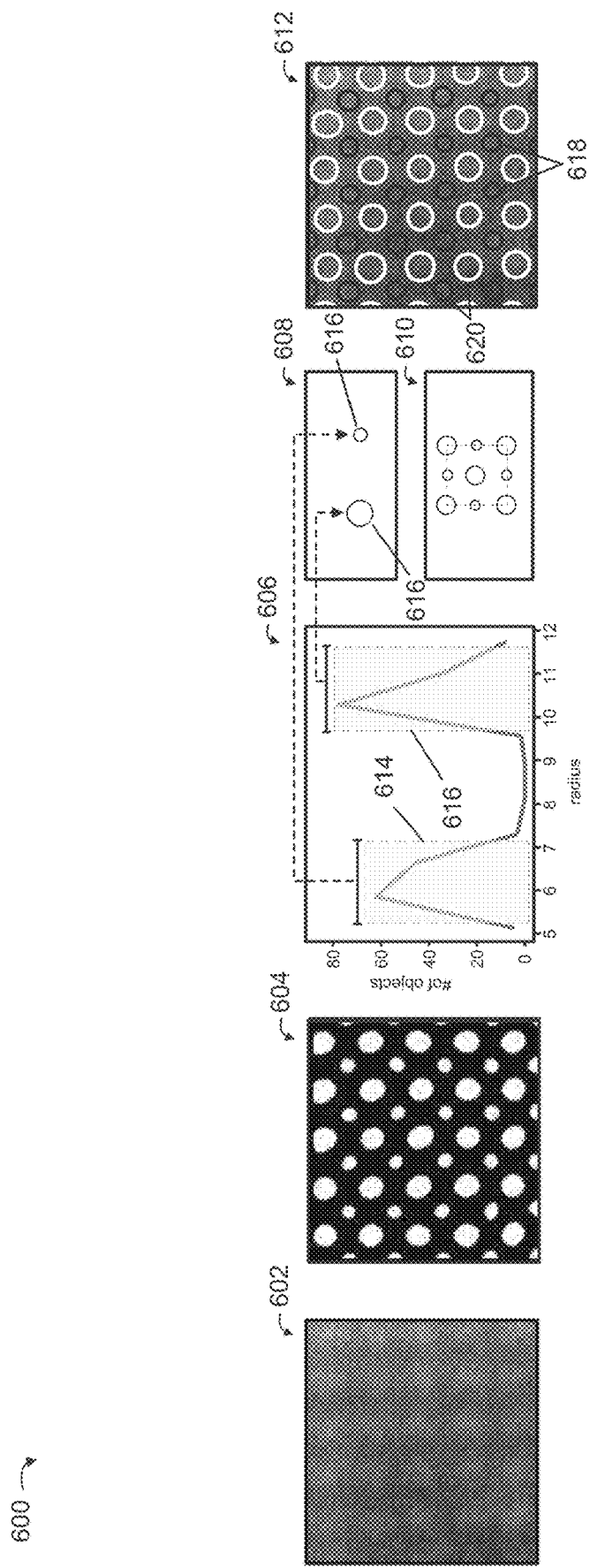
FIG. 6 illustrates a set of diagrams that illustrate a process for identifying structures of interest of different species in an initial image.

FIG. 6 shows a set of diagrams that illustrate a process 500 for identifying structures of interest of different species in an initial image. FIG. 6 shows a depiction of an initial image of a sample 602 comprising nanoparticles that was obtained using detector data from a first modality (HAADF detector data). Image 504 is generated by applying a neural network trained in sequence for denoising/segmentation charged particle images into regions likely to include an atom and a binary threshold probability algorithm to image 602. Regions that have been determined to have a likelihood of containing an atom that is greater than a threshold value are shown as white, while the regions that do not meet or exceed this threshold are shown as black. Based on image 604, an algorithm or user can determine which regions of the image correspond to atoms.

Image 606 corresponds to a graph of the radius of circles used to circle fit the individual binary objects of image 604. Graph 606 shows that there appear to be two species of atoms, a first species having a smaller radius 614, and a second species having a larger radius 616. Image 608 shows an average radius of the first species of atom 614 and the second species of atom 616. In some embodiments, an algorithm may estimate a likely species of each atom based on the average atom radius of the species. Similarly, image 610 shows an estimated crystalline structure of the atoms in the sample.

FIG. 6 further illustrates shows the initial image with a plurality of overlays 618 and 620 that correspond to regions of the initial image that have been determined to correspond to a structure of interest of the first species 614, and a structure of interest of the second species 616, respectively.

Figure 7:
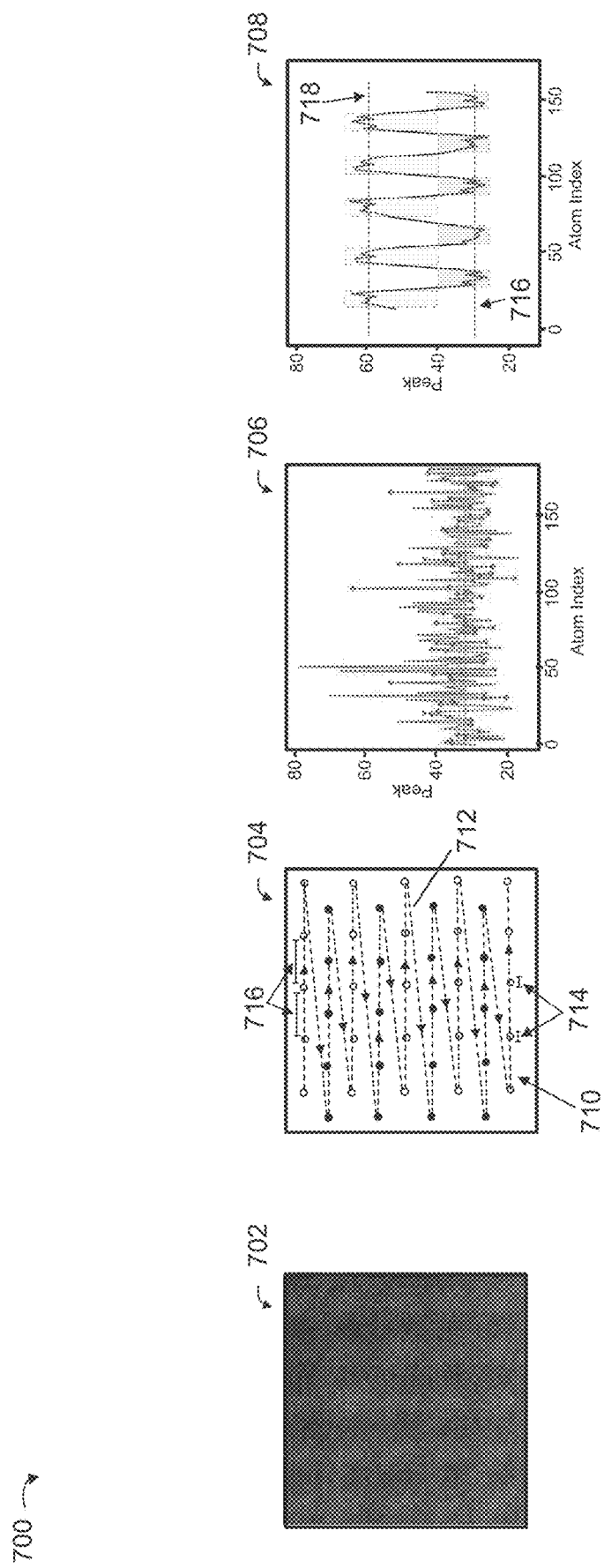
FIG. 7 illustrates a set of diagrams that illustrate a process for determining a composition of structures of interest identified within an initial sample image.

FIG. 7 shows a set of diagrams that illustrate a process 700 for determining a composition of structures of interest identified within an initial sample image. FIG. 7 shows a depiction of an initial image of a sample 702 comprising an array two species of atoms that was generated using HAADF detector data. FIG. 7 also shows a customized scan strategy 710 for the sample that is generated using methods and systems according to the present disclosure. The scan strategy 710 indicates a beam path 712 that the charged particle is to traverse when it irradiates the surface of the sample. Additionally, image 704 shows each portion of the beam path 712 as being associated with a dwell time (e.g., the amount of time the charged particle beam will irradiate the associated portion of the sample during execution of the scan strategy). Specifically, the scan strategy 712 includes first dwell times for first beam path portions 714 associated with the centers of the atoms identified in image, and second dwell times for second beam path portions 716 that are not associated with structures of interest.

Image 706 corresponds to a graph of EDS spectrum peak for each atom identified in image 702. In some embodiments, a composition of individual atoms is determined based on peak EDS spectrum detected when the associated region of the sample was irradiated with the charged particle beam. However, in other embodiments multiple sets of EDS data must be obtained by repeatedly scanning the sample with the customized scan strategy. For example, image 708 corresponds to a graph of an average EDS spectrum peak for each atom across a plurality of scans with the customized scan strategy. In some embodiments, the sample may be repeatedly scanned with the customized scan strategy until all atoms are identified, a threshold number are identified, are identified above a confidence interval, or a combination thereof. As shown in image 708, the average EDS peak associated with atoms of the first species converges to a first value 718 and the average EDS peak associated with atoms of the second species converges to a second value 718. The first value 716 and the second value 718 can then be used to determine the composition of the first species and the second species, respectively.

Figure 8:
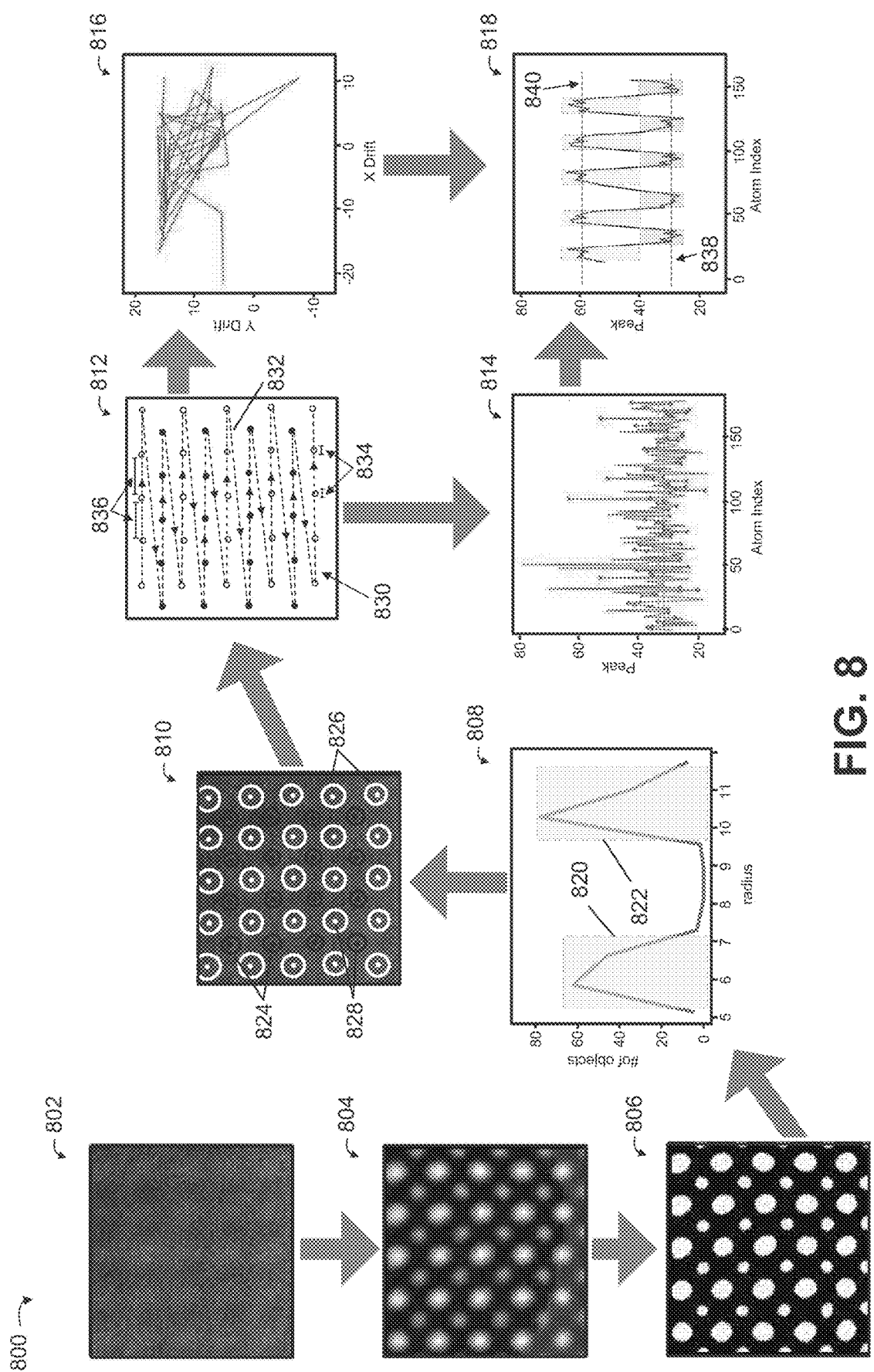
FIG. 8 illustrates a set of diagrams that illustrate an example process for determining a composition of structures of interest in a sample according to the present disclosure.

FIG. 8 shows a set of diagrams that illustrate an example process 800 for determining a composition of structures of interest in a sample according to the present disclosure. FIG. 8 includes an initial image of a sample 802 comprising an array two species of atoms that was generated using HAADF detector data. FIG. 8 also includes a modified version 802 to which one or more sharpening algorithm, one or more image recognition algorithms, or a combination thereof have been applied. Specifically, image 804 corresponds to the result of a neural network that has been train in sequence for denoising charged particle images and segmentation such images based on whether regions thereof are likely to include an atom. The resulting image 804 shows the probabilities that individual regions of the sample that the neural network contain an atom, with regions which have been determined to be more likely to include an atom being shown as lighter, and the regions which have been determined to be less likely to include an atom being shown as darker.

Image 806 corresponds to a version of image 804 to which a binary threshold probability has been applied. That is, regions that have been determined to have a likelihood of containing an atom that is greater than a threshold value are shown as white, while the regions that do not meet or exceed this threshold are shown as black. Based on image 806, an algorithm or user can determine which regions of the image correspond to atoms. Additionally, in some embodiments an algorithm or user can further identify regions that correspond to atoms of the same species.

Image 808 corresponds to a graph of the radius of circles used to circle fit the individual binary objects of image 806. Graph 808 shows that there appear to be two species of atoms, a first species having a smaller radius 820, and a second species having a larger radius 822. In some embodiments, the shape of the binary objects may be used to estimate a likely species of each atom (e.g., comparing the average radius to an atom species matching that radius).

FIG. 8 further includes image 810 which corresponds to the initial image with a plurality of overlays 824 and 826 that correspond to regions of the initial image that have been determined to correspond to a structure of interest (i.e., atom) of a first species, and a structure of interest (i.e., atom) of a second species, respectively. For example, these overlays 824 and 826 may be determined by applying a fit circle into the individual binary objects of image 806. Image 810 further shows representative pixel(s) 828 that have been determined to be representative of the corresponding region (i.e., a central pixel(s), pixel(s) furthest from an edge, and/or pixel(s) otherwise determined to have a high likelihood of returning compositional information relating to the corresponding structure of interest when irradiated). For example, the representative pixels 828 correspond to the center of the circles used to fit the binary objects.

FIG. 8 also shows a customized scan strategy 830 for the sample that is generated based on the representative pixel(s) 828. The scan strategy 830 indicates a beam path 832 that the charged particle is to traverse when it irradiates the surface of the sample. Additionally, image 812 shows each portion of the beam path 830 as being associated with a dwell time (e.g., the amount of time the charged particle beam will irradiate the associated portion of the sample during execution of the scan strategy). Specifically, the scan strategy 830 includes first dwell times for first beam path portions 834 associated with the centers of the atoms identified in image, and second dwell times for second beam path portions 836 that are not associated with structures of interest.

Image 814 corresponds to a graph of EDS spectrum peak for each atom identified in image 802. In some embodiments, a composition of individual atoms is determined based on peak EDS spectrum detected when the associated region of the sample was irradiated with the charged particle beam. However, in other embodiments multiple sets of EDS data must be obtained by repeatedly scanning the sample with the customized scan strategy. For example, image 814 corresponds to a graph of an average EDS spectrum peak for each atom across a plurality of scans with the customized scan strategy. In some embodiments, the sample may be repeatedly scanned with the customized scan strategy until all atoms are identified, a threshold number are identified, are identified above a confidence interval, or a combination thereof.

Image 816 is a graph that indicates the drift between different iterations of the sample being scanned using the customized scan strategy. The drift may be determined based on data obtained when the sample is scanned with the second dwell time (i.e., regions of the sample not containing a structure of interest). For example, the drift shown in graph 816 was determined using the HAADF data obtained when regions of the sample not including an atom was scanned. By comparing this HAADF data to previous iterations of the data obtained in prior scans, the relative drift of the sample/data can be determined between each iteration of data. This may allow for multiple iterations of data/images to be aligned, may be used to verify the location of EDS data as corresponding to the indexed atom center, adjusting the matching of EDS data so that the correct peak value is assigned to the center of the corresponding atom, or a combination thereof. For example, image 818 shows cumulative EDS data from a plurality of scans of the sample with the customized scan strategy 830 that has been drift corrected using HAADF data. As shown in image 818, the average EDS peak associated with atoms of the first species converges to a first value 838 and the average EDS peak associated with atoms of the second species converges to a second value 840. The first value 838 and the second value 840 can then be used to determine the composition of the first species and the second species, respectively.

Examples of inventive subject matter according to the present disclosure are described in the following enumerated paragraphs.

A1. A method for scanning a sample with a charged particle microscopy system, the system comprising: scanning a surface region of a sample with a charged particle beam to obtain a first image of the surface region with a first detector modality; determining a scan strategy for the surface region, the scan strategy comprising: a charged particle beam path; a first beam dwell time associated with at least one region of interest in the first image, the first beam dwell time being sufficient to obtain statistically significant data from a second detector modality; and at least a second beam dwell time associated with other regions of the first image, wherein the first beam dwell time is different than the second beam dwell time; scanning the surface region of the sample according to the scan strategy; obtaining, based on the surface region of the sample being scanned according to the scan strategy, first data from the second detector modality; and obtaining, based on the surface region of the sample being scanned according to the scan strategy, second data from the first modality.

A1.1. The method of paragraph A1, wherein determining the scan strategy comprises identifying at least one region of the first image that contains a structure of interest.

A1.1.1. The method of paragraph A1.1, wherein identifying the at least one region of the first image comprises segmenting the first image with a segmentation algorithm.

A1.1.1.1 The method of paragraph A1.1.1, wherein identifying the at least one region of the first image comprises presenting a segmented first image to a user, and receiving one or more selections of segments that are to be scanned with the second beam dwell time.

A1.2. The method of any of paragraphs A1-A1.1, wherein identifying the at least one region of the first image comprises Identifying a plurality of regions of the first image that each contain an instance of the structure of interest.

A1.3. The method of any of paragraphs A1.1-A1.2, wherein identifying the at least one region of the first image comprises identifying one or more pixels associated with each instance of the structure of interest in the first image.

A1.3.1. The method of paragraph A1.3, wherein identifying one or more pixels associated with each instance of the structure of interest in the first image corresponds to identifying a representative pixel associated with the instances of the structure of interest.

A1.3.1.1. The method of paragraph A1.3.1, wherein the representative pixel is a central pixel of the corresponding instance of the structure of interest in the first image.

A1.3.1.2. The method of paragraph A1.3.1, wherein the representative pixel is a pixel furthest from a boundary of the corresponding instance of the structure of interest in the first image.

A1.4. The method of any of paragraphs A1.1-A1.3.1.2, wherein the structure of interest corresponds to an atom.

A1.4.1. The method of paragraph A1.4, wherein the structure of interest corresponds to a species of atom.

A1.4.2. The method of any of paragraphs A1.4-A1.4.1, wherein the region of interest corresponds to a center of the atom.

A1.5. The method of any of paragraphs A1.1-A1.3.1.2, wherein the structure of interest corresponds to a chemical compound.

A1.6. The method of any of paragraphs A1.1-A1.3.1.2, wherein the structure of interest corresponds to a nanoparticle.

A1.7. The method of any of paragraphs A1.1-A1.3.1.2, wherein the structure of interest corresponds to a portion of a nanoparticle.

A1.7.1. The method of paragraph A1.7, wherein the portion of the nanoparticle is one of a boundary, an edge, a material transition, and a component substructure.

A1.8. The method of any of paragraphs A1-A1.7.1, wherein identifying the at least one region of the first image comprises sharpening the first image with a sharpening algorithm.

A1.8.1. The method of paragraph A1.8, wherein the sharpening algorithm comprises a neural network.

A1.9. The method of any of paragraphs A1.1-A1.8.1, wherein determining the scan strategy comprises identifying at least one additional region of the first image that contain a different structure of interest.

A1.9.1. The method of paragraph A1.9, wherein identifying the at least one additional region comprises Identifying a plurality of additional regions of the first image that each contain an instance of the different structure of interest.

A1.9.2. The method of any of paragraphs A1.9-A1.9.1, wherein determining the scan strategy comprises identifying a plurality of sets of regions of interest of the first image, each set comprising one or more regions of the first image that contain to a corresponding structure of interest.

A1.9.3. The method of any of paragraphs A1.9-A1.9.2, wherein the different structure of interest is of a different type than the structure of interest.

A1.9.4. The method of any of paragraphs A1.9-A1.9.3, wherein the different structure of interest is of a different species than the structure of interest.

A1.10. The method of any of paragraphs A1.1-A1.9.4, wherein instances of individual structure of interests in the first image are identified by a trained neural network.

A1.11. The method of any of paragraphs A1.1-A1.9.10, wherein determining the scan strategy comprises determining that a particular region is an empty space, and assigning a reduced beam dwell time to the particular region.

A1.12. The method of any of paragraphs A1.1-A1.9.11, wherein determining the scan strategy comprises determining that a particular region is not a region of interest, and assigning a reduced beam dwell time to the particular region.

A2. The method of any of paragraphs A1-A1.12, wherein the scan strategy comprises scanning portions of the sample that correspond to the at least one region of interest in the first image with the second beam dwell time.

A2.1. The method of paragraph A2, wherein the second beam dwell time induces at least a threshold amount of emissions necessary to obtain statistically significant data from the second detector modality.

A2.2. The method of any of paragraphs A2-A2.1, wherein scanning portions of the sample that correspond to the at least one region of interest in the first image with the second beam dwell time corresponds to scanning portions of the sample that correspond to representative pixels of the first image that correspond to at least a portion of the region of interest.

A2.3. The method of any of paragraphs A2-A2.2, wherein the scan strategy comprises scanning portions of the sample that do not correspond to the at least one region of interest in the first image with the first beam dwell time.

A2.4. The method of any of paragraphs A2-A2.3, wherein the scan strategy further comprises a third beam dwell time associated with other regions of the first image associated with instances of a different structure of interest, and wherein the third beam dwell time is different than the second beam dwell time and the first beam dwell time.

A2.5. The method of any of paragraphs A2-A2.3, wherein the scan strategy further comprises a plurality of additional beam dwell times, each additional beam dwell time being associated with corresponding regions of the first image associated with instances of structures of interest of a corresponding type or species.

A3. The method of any of paragraphs A1-A2.5, wherein the method comprises determining, based on the first data from the second detector modality, a composition of the at least one region of interest.

A3.1. The method of paragraph A3, further comprising determining that the composition of one or more of the regions of interest cannot be identified with the first data, obtaining a new scan.

A3.1.1. The method of paragraph A3.1, wherein obtaining a new scan comprises scanning the surface region of the sample according to the scan strategy an additional time.

A3.1.2. The method of any of paragraphs A3.1-A3.1.1, further comprising repeating the scanning of the surface region of the sample according to the scan strategy an until a threshold amount of regions of interest are identified.

A3.1.3. The method of any of paragraphs A3.1-A3.1.1, further comprising repeating the scanning of the surface region of the sample according to the scan strategy an until it is determined that additional scans will cause sample damage.

A3.2. wherein the method comprises determining, based on the first data from the second detector modality, a composition of a structure of interest.

A3.2. The method of any of paragraphs A3-A3.1, wherein the second modality is one of EDS and EELS.

A3.3. The method of any of paragraphs A3-A3.2, wherein irradiation of the sample with the second beam dwell time causes an insufficient amount of emissions to determine composition.

A4. The method of any of paragraphs A1-A3.3, wherein the first detector modality is dark field imaging.

A4.1. The method of paragraph A4, wherein the first detector modality is HAADF.

A5 The method of any of paragraphs A1-A4.1, wherein the second detector modality is one of diffraction pattern, EELS, EDS, cathodoluminescence, and backscatter electrons.

A6. The method of any of paragraphs A1-A5, further comprising determining the first beam dwell time.

A6.1. The method of paragraphs A6, wherein the first beam dwell time is determined based on the type, size, and/or species of the structure of interest.

A6.2. The method of any of paragraphs A6-A6.1, wherein the first beam dwell time is determined based on the type and/or sensitivity of the second modality.

A6.3. The method of any of paragraphs A6-A6.2, wherein the first beam dwell time is determined based on a material of the structure of interest.

A7. The method of any of paragraphs A1-A6.3, wherein the strategy further comprises scanning the region of the sample that corresponds to the at least one region of interest in the first image with a different beam strength.

A8. The method of any of paragraphs A1-A7, wherein the first image is obtained by scanning the surface region of the sample with the charged particle beam at the second beam dwell time.

A9. The method of any of paragraphs A1-A8, wherein statistically significant data corresponds to the data that describes a material property, multiple material properties, and/or their relations.

A9.1. The method of paragraph A9, wherein the statistically significant data includes a quantity or quality of data describing the material property, multiple material properties, and/or their relations that is statistically not the result of chance.

A9.2. The method of any of paragraphs A9-A9.1, wherein the statistically significant data includes a quantity or quality of data describing the material property, multiple material properties, and/or their relations sufficient to allow a compositional determination to be made about the corresponding region of the sample within a threshold number of scans conducted using the scan strategy.

A9.2.1. The method of paragraphs A9.2, wherein the threshold number of scans is 1, 10, 25, or 100.

A9.2.2. The method of any of paragraphs A9.2-A9.2.1, the statistically significant data includes a quantity or quality of data sufficient to allow a determination of a species of atom and/or material composition of a nanoparticle or portion thereof.

A10. The method of any of paragraphs A1-A9.2.2, further comprising generating a second image with the second data, and using the second image to align the first data.

A10.1. The method of paragraph A10, wherein aligning the first data comprises: determining, based on a comparison of the first image and the second image, a drift; and compensating the first data to account for the drift.

A11. The method of any of paragraphs A1-A10.1, further comprising generating a second image with the second data, and using the second image to determine a drift between the first image and the second image.

A12. The method of any of paragraphs A1-A11, wherein the scan strategy further comprises a third beam dwell time associated with other regions of the first image, and wherein the third beam dwell time is different than the second beam dwell time and the first beam dwell time.

A12.1. The method of paragraph A12, wherein when the other regions of the first image are scanned with the third dwell time, the third beam dwell time induces at least a threshold amount of emissions necessary to obtain statistically significant data from a third detector modality, wherein the third detector modality is different than the first detector modality and the second detector modality.

A12.2. The method of any of paragraphs A12-A12.1, wherein the other regions of the first image are associated with instances of a different structure of interest.

A12.3. The method of any of paragraphs A12-A12.2, wherein the scan strategy further comprises one or more additional beam dwell times associated with other regions of the first image, and wherein the one or more additional beam dwell times are determined such that when the other regions of the first image are scanned with the one or more additional beam dwell times, they induce at least a threshold amount of emissions necessary to obtain statistically significant data from one or more additional detector modalities.

A13. The method of any of paragraphs A1-A12.3, wherein the first dwell time and the second dwell time have at least one different parameter that causes the dose and/or irradiation time experienced portions of the sample irradiated by the first dwell time and the second dwell time to be different.

A13.1. The method of paragraph A13, wherein the dwell time corresponds to the amount of time the charged particle beam will irradiate associated portions of the sample during execution of the scan strategy.

A13.2. The method of any of paragraphs A13-A13.1, wherein the dwell time corresponds to a pixel density being scanned by the charged particle beam when irradiating the associated portions of the sample.

A13.3. The method of any of paragraphs A13-A13.2, wherein the dwell time corresponds to size of the pixels being scanned by the charged particle beam when irradiating the associated portions of the sample.

A13.4. The method of any of paragraphs A13-A13.3, wherein the dwell time corresponds to a pulse length of the charged particle beam when irradiating the associated portions of the sample.

A13.5. The method of any of paragraphs A13-A13.4, wherein the dwell time corresponds to a pulse frequency of the charged particle beam when irradiating the associated portions of the sample.

B1. A system for scanning a sample with a charged particle microscopy system, the system comprising: a sample holder configured to hold a sample; a charged particle source configured to emit a beam of charged particles towards the sample; an optical column configured to cause the beam of charged particles to be incident on the sample; one or more detectors configured to detect charged particles of the charged particle beam and/or emissions resultant from the charged particle beam being incident on the sample, the one or more detectors comprising at least a first detector of a first modality and a second detector of a second modality; one or more processors; and a memory storing computer readable instructions that, when executed by the one or more processors, cause the system to perform the method of any of paragraphs A1-A12.3.

C1. Non-transitory computer readable instructions, that when executed on one or more processors of a charged particle microscopy system, cause the one or more processors to perform the methods of any of paragraphs A1-A12.3.

D1. Use of a smart sample holder of paragraph B1 to perform any of the methods of paragraphs A1-A12.3.

What is claimed is:

1. A method for scanning a sample with a charged particle microscopy system, the system comprising:
   identify a structure of interest in a first image of a surface region of a sample;
   determining a scan strategy for the surface region, the scan strategy comprising:
      a charged particle beam path;
      a first beam dwell time associated with at least one region including the structure of interest in the first image, the first beam dwell time being sufficient to obtain statistically significant data from a first detector modality; and
      at least a second beam dwell time associated with other regions of the first image to obtain data from a second detector modality, wherein the first beam dwell time is different than the second beam dwell time;
   scanning the surface region of the sample according to the scan strategy;
   obtaining, in a single pass and based on the surface region of the sample being scanned according to the scan strategy, first data from the first detector modality; and
   obtaining, in the single pass and based on the surface region of the sample being scanned according to the scan strategy, second data from the first second detector modality.

2. The method of claim 1, wherein identifying the structure of interest includes identifying one or more pixels associated with each instance of the structure of interest in the first image.

3. The method of claim 1, wherein the structure of interest corresponds to one of an atom, a species of atom, a chemical compound, a nanoparticle, and a portion of a nanoparticle.

4. The method of claim 1, wherein the scan strategy further comprises a third beam dwell time associated with other regions of the first image associated with instances of a different structure of interest, and wherein the third beam dwell time is different than the second beam dwell time and the first beam dwell time.

5. The method of claim 1, further comprising determining that a composition of the at least one region including the structure of interest cannot be identified with the first data, causing the surface region of the sample to be scanned according to the scan strategy an additional time.

6. The method of claim 1, further comprising repeating the scanning of the surface region of the sample according to the scan strategy until a threshold amount of regions including structures of interest are identified.

7. The method of claim 1, further comprising determining, based on the first data from the first detector modality, a composition of the structure of interest.

8. The method of claim 1, wherein the second detector modality is HAADF.

9. The method of claim 1, wherein the first detector modality is one of diffraction pattern, EELS, EDS, cathodoluminescence, and backscatter electrons.

10. The method of claim 1, further comprising determining the first beam dwell time based on at least one of:
    a type of the structure of interest;
    a size of the structure of interest;
    a species of the structure of interest;
    a type of the first detector modality; and
    a sensitivity of the first detector modality.

11. The method of claim 1, further comprising determining the first beam dwell time based on a material of the structure of interest.

12. The method of claim 1, wherein determining the scan strategy further comprises scanning the at least one region including the structure of interest with a first beam strength and scanning the other regions with a second beam strength.

13. The method of claim 1, wherein the first image is obtained by scanning the surface region of the sample with the charged particle beam at the second beam dwell time.

14. The method of claim 1, wherein the scan strategy further comprises a third beam dwell time associated with other regions of the first image associated with instances of a different structure of interest, wherein:
    the third beam dwell time is different than the second beam dwell time and the first beam dwell time; and
    when the other regions of the first image are scanned with the third dwell time, the third beam dwell time induces at least a threshold amount of emissions necessary to obtain statistically significant data from a third detector modality that is different than the first detector modality and the second detector modality.

15. The method of claim 1, further comprising determining a drift between the first image and the first data based at least in part on the second data.

16. The method of claim 1, further comprising:
    generating a second image with the second data, and
    using the second image to determine a drift between the first image and the second image.

17. A system for scanning a sample with a charged particle microscopy system, the system comprising:
    a sample holder configured to hold a sample;
    a charged particle source configured to emit a beam of charged particles towards the sample;
    an optical column configured to cause the beam of charged particles to be incident on the sample;
    one or more detectors configured to detect charged particles of the charged particle beam and/or emissions resultant from the charged particle beam being incident on the sample, the one or more detectors comprising at least a first detector of a first modality and a second detector of a second modality;
    one or more processors; and
    a memory storing computer readable instructions that, when executed by the one or more processors, cause the system to:
       identify a structure of interest in a first image of a surface region of a sample;
       determine a scan strategy for the surface region, the scan strategy comprising:
          a charged particle beam path;
          a first beam dwell time associated with at least one region including the structure of interest in the first image, the first beam dwell time being sufficient to obtain statistically significant data from a first detector modality; and
          at least a second beam dwell time associated with other regions of the first image to obtain data from a second detector modality, wherein the first beam dwell time is different than the second beam dwell time;
       scan the surface region of the sample according to the scan strategy;
       obtain, based on the surface region of the sample being scanned according to the scan strategy, first data from the first detector modality; and
       obtain, based on the surface region of the sample being scanned according to the scan strategy, second data from the second modality.

18. The system of claim 17, wherein identifying the structure of interest includes identifying one or more pixels associated with each instance of the structure of interest in the first image.

19. The system of claim 17, wherein the instructions further cause the system to determine a composition of the structure of interest based on the first data from the first detector modality.

20. The system of claim 17, wherein the scan strategy further comprises a third beam dwell time associated with other regions of the first image associated with instances of a different structure of interest, and wherein the third beam dwell time is different than the second beam dwell time and the first beam dwell time.

* * * * *